INVENTOR
GEORGE D. VENDELIN

E. Mickey Hubbard
ATTORNEY

Aug. 6, 1968 G. D. VENDELIN 3,396,317

SURFACE-ORIENTED HIGH FREQUENCY DIODE

Filed Nov. 30, 1965 2 Sheets-Sheet 2

INVENTOR:

GEORGE D. VENDELIN

E. Mickey Hubbard

ATTORNEY

United States Patent Office 3,396,317

Patented Aug. 6, 1968

3,396,317

SURFACE-ORIENTED HIGH FREQUENCY DIODE

George D. Vendelin, Richardson, Tex., assignor to Texas Instruments Incorporated, Dallas, Tex., a corporation of Delaware Filed Nov. 30, 1965, Ser. No. 510,491
5 Claims. (Cl. 317—234)

ABSTRACT OF THE DISCLOSURE

A diode structure is disclosed including a high resistivity substrate and a low resistivity epitaxial layer on one surface. A pair of opposite conductivity type regions are provided extending through the low resistivity layer from one surface and into the high resistivity substrate. These opposite conductivity type regions are spaced with a portion of the low resistivity layer between them for forming a P–N junction.

This invention relates generally to semiconductor fabrication processes and devices, and more particularly relates to a surface-oriented diode for integrated circuit applications where low losses and low package parasitics are required.

Conventional microwave diode devices are not adaptable to monolithic integrated circuit structures and are further limited for use at high frequencies by package inductance and capacitance. Current attempts to fabricate microwave diodes in integrated circuit structures so as to reduce the package losses have centered around the so-called surface-oriented concept. In a surface-oriented diode, the anode and cathode contacts emerge at the surface of the wafer and the diode junction is disposed essentially perpendicular to the surface of the wafer. The maximum operating frequency of these diodes has been limited to a large extent by the high loss of the capacitance which is not perpendicular to the surface of the wafer.

In many microwave applications it is of the utmost importance that the value of Q for the diode be high. The value of Q is expressed by the equation $$Q=1/2\pi FCR$$

where F is the frequency, C the capacitance measured across the terminals of the diode, and R the series resistance measured across the diode terminals. The cutoff frequency of the diode occurs when $Q=1$. As a practical matter, a diode must be operated at a sufficiently low frequency that Q is about ten. Thus it will be evident that if a diode is to be operated at a high frequency, the product CR must be reduced to a very low value by the design of the diode. A semiconductor diode has an inherent capacitor across the p–n or p–i–n junction which is determined generally by the width of the reverse bias depletion layer and the areas of the opposed boundaries of the depletion layer which may be analogized to capacitor plates. Since the width of the depletion layer changes with changes in the magnitude of the reverse bias, the capacitance changes with reverse bias, and this feature is used to advantage in some reactive circuits such as harmonic generators wherein the diode is referred to as a varactor. The diode also has certain stray and parasitic capacitances as a result of the packaging of the diode. For very high frequency applications, such as in the X-band, the stray or parasitic capacitance in conventional discrete diodes and previous integrated circuit diodes is generally greater than the limit permissible, as a practical matter, for the total capacitance of the diode.

Therefore, an important object of this invention is to provide a diode having a very low CR product and therefore a high Q and a high cutoff frequency.

Another very important object of the invention is to provide such a diode which is suitable for use in integrated circuits.

Still another object is to provide a diode wherein the series resistance remains more constant with changes in the reverse bias.

Yet another object is to provide a diode wherein the junction capacitance tends to decrease faster with an increase in reverse bias.

A further object is to provide a diode in which the capacitance and inductance resulting from the metal contacts are very low.

Another object is to provide a diode wherein very small junction areas and junction capacitance can be obtained.

Still another object is to provide a diode suitable for use at X-band frequencies.

Another object is to provide a device which may be used in many microwave applications, such as in harmonic generators, phase shifters, tuners, switching applications and the like.

These and other objects are accomplished by means of a high resistivity monocrystalline semiconductor substrate, a thin layer of low resistivity N-type semiconductor material formed on the substrate, a first high impurity concentration diffused region of one conductivity type extending through the layer of N-type semiconductor material into the high resistivity substrate, and a second high impurity concentration diffused region of the other conductivity type extending through the layer of N-type semiconductor material into the substrate, the first and second diffused regions being disposed in adjacent relationship to form a diode junction.

More specifically, the diode comprises a very high resistivity, monocrystalline semiconductor substrate, a thin epitaxial layer of N-type semiconductor material having a low resistivity selected to provide the desired breakdown voltage, and first and second heavily doped diffused regions of opposite conductivity types extending through the epitaxial layer into the high resistivity substrate at spaced points to form the p–i–n diode junction within the epitaxial layer.

In accordance with a more specific aspect of the invention, the substrate is P-type semiconductor material so that the boundary of the depletion layer adjacent the N-type diffused region will lie wholly within the epitaxial N-type layer and will tend to decrease in area with an increase in reverse bias, thereby providing a retrograde effect to decrease the capacitance at a faster rate with an increase in reverse bias.

In accordance with the process of the invention, a diode is fabricated by epitaxially forming a thin N-type layer on a high resistivity monocrystalline substrate, and then successively diffusing first and second regions of opposite conductivity type through the epitaxial layer into the high resistivity substrate at adjacent points to form a diode junction.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
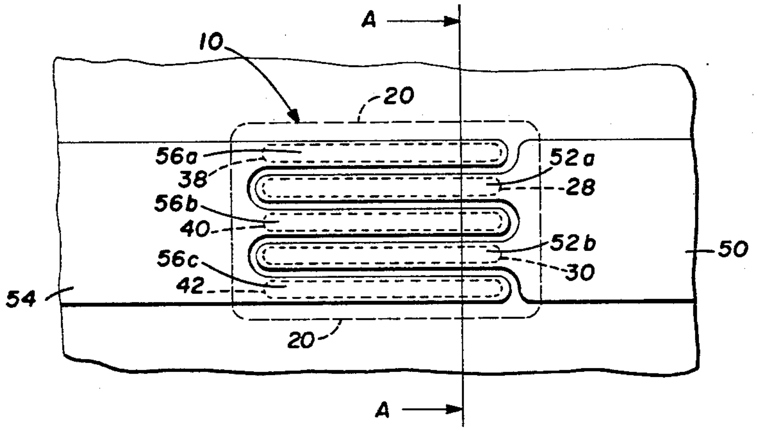
FIGURE 1 is a plan view of a diode constructed in accordance with the present invention.

Referring now to the drawings, a diode constructed in accordance with the present invention is indicated generally by the reference numeral 10. The construction of the diode 10 can best be understood by first describing the process for fabricating the diode. FIGURES 2, 3, 4, 5 and 6 illustrate successive stages of fabrication of the diode 10.

The starting material for fabricating the diode 10 is a very high resistivity substrate 12. For most applications the substrate 12 should have as high a resistivity as possible, a resistivity greater than 4,000 ohm-centimeters being possible, although the resistance may vary for different applications. The substrate may be either P-type or N-type and may be silicon or other semiconductor material. In the preferred embodiment here illustrated, the substrate 12 is P-type silicon. After taking steps to provide suitable index marks which will remain visible throughout the fabrication process for alignment purposes, the substrate 12 is placed in a suitable conventional reactor furnace and heated to about 1200° C. to grow a thermal oxide masking layer 14 to a thickness of about 12,000 angstroms. The oxide layer 14 is then patterned by conventional photo-resist and etching techniques to leave an opening 16.

Figure 2:
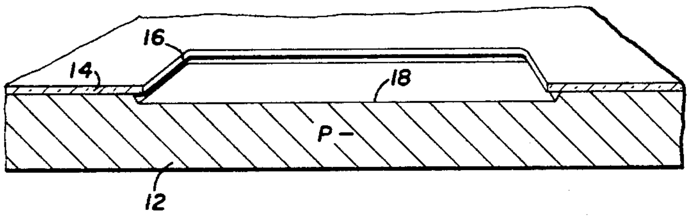
FIGURES 2, 3, 4, 5 and 6 are sectional views taken substantially on lines A—A of FIGURE 1 which illustrate successive stages in the fabricating of the diode of FIGURE 1 as well as the novel features of the diode.
Figure 3:
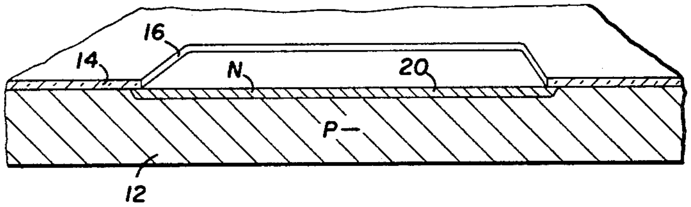
Figure 4:
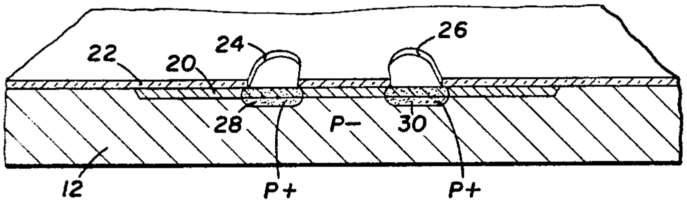
Figure 5:
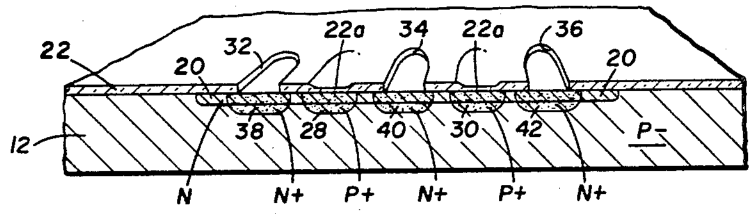

Next the substrate 12 is subjected to an etchant to etch a pin 18 in the area exposed by the opening 16 as illustrated in FIGURE 2. The depth of the pit 18 is closely controlled, and is very shallow, on the order of about 0.1 mil, for example. Then the pit 18 is refilled by an epitaxially grown semiconductor layer 20 as illustrated in FIGURE 3. The epitaxial layer 20 is doped with a suitable N-type doping impurity, such as antimony, to provide as low a resistance as possible and still provide the desired breakdown voltage. For example, 0.45 ohm-centimeter silicon doped with antimony will provide about a fifty volt reverse breakdown voltage when using the geometry and size which will presently be described.

The etching of the pit 18 and the redeposit of the epitaxial layer 20 is preferably accomplished by a process which converts from an etching condition to a depositing condition as smoothly as possible and with a minimum of cost. The general formula for one such reaction is $$SiCl_4 + 2H_2 \overset{\Delta}{=} 4HCl + Si$$

wherein hydrochloric acid and silicon tetrachloride vapors are carried through the reactor by a stream of hydrogen gas. This reaction can be carried out without removing the substrate from a reactor because the constituents during etching are substantially the same as those during the epitaxial deposition. The reaction is forced to the left, to obtain an etching condition, by providing an excess of hydrochloric acid vapors or no silicon tetrachloride vapors. The change from an etching condition to one of deposition merely requires that the quantity of hydrochloric acid vapors be decreased or terminated while increasing or maintaining the flow of silicon tetrachloride. For example, a temperature of approximately 1200° C. and a flow rate of thirty liters per minute of an etchant consisting of about 95% $H_2$ and 5% HCl can be expected to result in an etch rate of approximately 0.22 micron per second on a silicon substrate. The etchant vapors do not materially affect the silicon dioxide film 14 which serves as the mask. In order to reverse the process, the flow of hydrochloric acid vapors is terminated and silicon tetrachloride vapors passed through the reactor. The reactant stream for deposition also contains the vapors of a compound of a suitable doping impurity, antimony for example, in a concentration selected to provide the desired impurity concentration in the epitaxial layer.

Next the oxide mask 14 is removed by a suitable chemical etch, such as dilute hydrofluoric acid, and another oxide layer thermally regrown to a thickness on the order of 10,000 angstroms. The oxide layer 22 is patterned by conventional photo-resist and etch techniques to form openings 24 and 26 through which heavily doped P-type anode diffusions 28 and 30 are then made. The diffusions 28 and 30 may be made by heating the substrate to about 1150° C. in the presence of a nitrogen carrier gas containing the vapors of a boron compound, such as boron tribromide, and a small percentage of oxygen for a short period of time. This results in the deposit of a thin boron glass film (i.e., boron oxide) over that portion of the surface of the epitaxial layer 20 exposed by the openings 24 and 26 and the very shallow, high concentration diffusion of boron into the surface of the epitaxial layer. After the boron glass has been stripped from the surface of the substrate by a suitable etchant, such as dilute hydrofluoric acid, the substrate is heated to about 1100° C. for a period of time sufficient to diffuse the boron through the epitaxial layer 20 into the substrate 12, preferably to a total depth approximately twice the thickness of the epitaxial layer 20. It is very important that the diffused regions 28 and 30 extend through the epitaxial layer 20 into the high resistivity substrate 12 for reasons which will hereafter be discussed in greater detail.

The substrate is then slow cooled and maintained at about 900° C. in the presence of steam for about three hours to regrow the oxide film 22 over the diffused regions 28 and 30 as indicated at 22*a*. After openings 32, 34 and 36 are cut in the oxide layer 22, heavily doped cathode diffusions 38, 40 and 42 are made through the openings using conventional diffusion techniques. For example, the substrate may be heated to a temperature of about 1100° C. in the presence of a nitrogen atmosphere including the vapors of an N-type doging impurity, such as a phosphorus compound, and a small percentage of oxygen for about thirty minutes. This results in a phosphorus oxide film over the surface of the epitaxial layer exposed by the openings 32, 34 and 36 and a high concentration shallow diffused region of the phosphorus. After the phosphorous oxide film is stripped from the epitaxial layer 20, the substrate is heated to a temperature of about 1100° C. for about thirty minutes to diffuse the phosphorus through the epitaxial layer 20 into the high resistivity substrate, preferably to a total depth equal to about twice the depth of the epitaxial layer 20.

The openings 24, 26, 32, 34 and 36 are then reopened by conventional photo-resist and etch techniques and a metalized film, such as aluminum, deposited over the surface of the substrate. The metalized film is then patterned by photo-resist and etch techniques to form a stripline 50 having anode contact fingers 52*a* and 52*b*, and a stripline 54 (see FIGURE 1) having cathode contact fingers 56*a*, 56*b* and 56*c*. In most high frequency, integrated circuit applications, a metalized layer 60, such as aluminum, is also deposited over the opposite side of the substrate 12 to form a ground plane.

In the diode 10, the P+ diffused regions 28 and 30 form the anodes, the N+ diffused regions 38, 40 and 42 form the cathodes, and the epitaxial layer 20 between each of the adjacent diffused regions forms the intrinsic region of a p–i–n junction. When the P+ regions are positive wth respect to the N+ regions, the diode is forward biased, and conversely, when the P+ regions are more negative than the N+ regions, the diode is reverse biased.

An important aspect of the invention is that the substrate 12 has an extremely high resistivity, while the epitaxial layer 20 has as low a resistivity as possible and still maintains the desired reverse breakdown voltage. Of course, the heavily doped anode and cathode regions have an even lower resistivity. In a typical diode, the concentration of boron in the silicon substrate 12 may be on the order of about $4\times10^{12}$ or less atoms per cc. and a resistivity greater than 4,000 ohm-centimeters. The epitaxial layer 20 might have an antimony concentration of about $1.4\times10^{16}$ atoms per cc. and a resistivity of only 0.45 ohm-centimeter. The P+ regions 28 and 30 might $1\times10^{20}$ or greater atoms of phosphorus per cc. at the surface while the N+ regions 38, 40 and 42 might have $1\times10^{20}$ or greater atoms of phospohorus per cc. at the surface. Each of the five interdigitated diffused regions might have a width of about 1 mil, a depth less than 0.5 mil, and a spacing less than 0.5 mil under zero bias condition. The epitaxial layer 20 might have a depth as low as 0.1 mil. The diode might then have a reverse breakdown voltage on the order of fifty volts. It is to be understood that the foregoing values are not intended to restrict the scope of the invention but are presented merely as exemplary of a typical device fabricated in accordance with the present invention.

Figure 6:
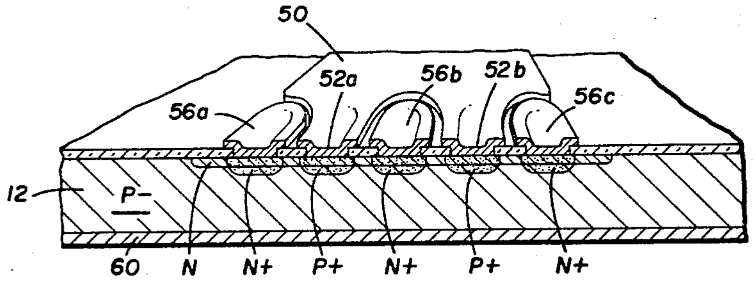
Figure 7:
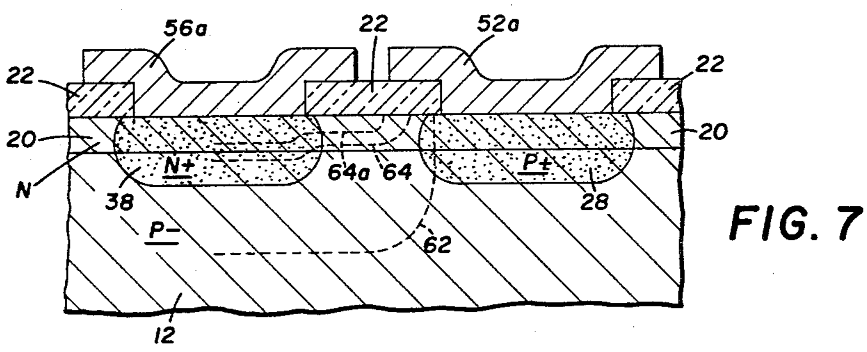
FIGURE 7 is an enlarged view of a portion of FIGURE 6 which serves to illustrate the operation of the diode of FIGURE 1.
Figure 8:
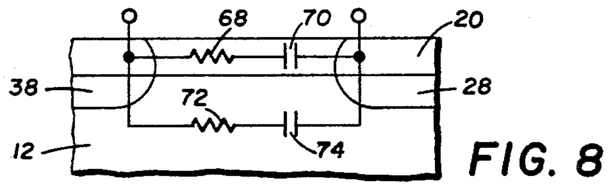
FIGURE 8 is a schematic drawing of the equivalent circuit of the diode of FIGURE 1.

One of the principal advantages of the diodes illustrated in FIGURES 1 and 6 is that the CR product, which determines the value of Q and consequently the maximum cutoff frequency of the diode, is maintained at a very low value. Insofar as the capacitance and resistance between the anode and cathode regions of the diode are concerned, the diode can be represented as two parallel circuits as shown in FIGURE 8. One of the parallel circuits, comprised of resistor 68 and capacitor 70, represents the circuit through the low resistivity layer 20 from the anode to the cathode regions, and the other, comprised of resistor 72 and capacitor 74, represents the circuit through the substrate 12. The resistor 72, which represents the resistance of the substrate 12, is extremely high, while the resistor 68, which represents the resistance of the epitaxial layer 20, is extremely low. Under reverse bias conditions, the boundaries of the depletion layer may be represented by the dotted lines 62 and 64. It will be noted that the width of the depletion layer is much less in the epitaxial layer 20 than in the substrate 12. As a result, the capacitor 74 in the circuit through the substrate 12 is very low because of the high resistivity and the relatively wide spacing, while the capacitor 70 in the circuit through the epitaxial layer 20 is significantly larger. Since the resistance 72 is very large and the capacitance 74 very small, the parallel circuit through the substrate 12 is insignificant in the calculation of the CR product of the diode. Thus only the circuit through the epitaxial layer 20 is of any significance in the diode. As mentioned, the resistivity of the epitaxial layer 20 is extremely low by design. The dimensions of the diode should be selected so that the depletion layer will extend to N-type diffused regions at the reverse breakdown voltage so that no excess resistance will be included in the epitaxial layer. Further, the area of the effective junction in the epitaxial layer 20 may be closely controlled and may be made extremely small merely by controlling the thickness of the epitaxial layer 20. Thus both the resistance and the capacitance of the effective circuit of the diode are small so that the CR product is also small, and the Q value and therefore the cutoff frequency are high.

Within the broader aspects of the invention, the substrate 12 may be either P-type or N-type semiconductor material. However, the conductivity type of the substrate 12 will affect the geometry of the depletion layer defined by the dotted lines 62 and 64 which are illustrated for a P-type substrate. In general, a P-type substrate is preferred for diodes to be used in reactive applications because of a retrograde junction effect which tends to increase the degress of change of capacitance of the diode with a change in the magnitude of the reverse bias voltage. When the substrate 12 has a P-type conductivity, the boundary of the depletion layer represented by the dotted line 64 stays within the N-type epitaxial layer 20. As previously discussed, the effective capacitance of the diode lies wholly within the epitaxial layer 20. This capacitance is related to the area of the boundary of the depletion layer because the boundaries on either side of the depletion layer simulate the capacitor plates. As the reverse bias voltage increases, the width of the depletion layer increases so that the boundary of the depletion layer represented by the dotted line 64 tends to move to the position of the dotted line 64*a*, thus materially reducing the total area of the boundary and thereby reducing the capacitance at a greater rate than would occur if the boundary 64 passed vertically through the epitaxial layer 20. This tends to provide an advantageous increase in the rate of change in capacitance for reactive applications, such as the use of the diode as a varactor in a harmonic generator.

Although preferred embodiments of the invention have been described in detail, it is to be understood that various changes, substitutions and alterations can be made therein without departing from the spirit and scope of the invention as defined by the appended claims.

What is claimed is:

1. A diode comprising a monocrystalline body including a high resistivity substrate of a material having a relatively low concentration of first carrier producing means and a relatively thin epitaxial surface layer of a material having a substantially greater concentration of a second carrier producing means, first and second regions of respective opposite conductivity type material extending through said layer from the surface thereof into the substrate, said regions being spaced with a portion of said layer between them for forming a P–N junction, said second carrier producing means in combination with said first carrier producing means constituting means for substantially concentrating the current flow between said regions to said thin surface layer.

2. The combination defined in claim 1 wherein the low resistivity semiconductor layer is an N-type epitaxial layer formed on the substrate.

3. The combination defined in claim 2 wherein the substrate is P-type silicon and the epitaxial layer is silicon.

4. The combination defined in claim 2 wherein the epitaxial layer is inset in the surface of the substrate and further characterized by an insulating layer disposed over the surface of the epitaxial layer and the surface, and first and second stripline conductors deposited on the surface of the substrate and extending through the insulating layer into contact with the surface of the first and second diffused regions, respectively.

5. In a semiconductor diode, the combination of a high resistivity, monocrystalline semiconductor substrate, a low resistivity N-type semiconductor layer inset in and epitaxial to the substrate, a plurality of elongated, heavily doped P-type diffused regions etxending through the semiconductor layer into the substrate and disposed in spaced, parallel relationship, a plurality of elongated, heavily doped N-type diffused regions extending through the semiconductor layer into the substrate, the N-type diffused regions being interlaced with the P-type diffused regions to form diode junction areas, an insulating layer formed over the surface of the semiconductor layer and the substrate having an opening therein over each of the diffused regions, a first conductor strip on the insulating layer extending through openings in the insulating layer into contact with the P-type diffused regions, and a second conductor strip on the insulating layer extending through openings in the insulating layer into contact with the N-type diffused regions.

References Cited

UNITED STATES PATENTS

| | | | |
|---|---|---|---|
| 2,981,877 | 4/1961 | Nayce | 317—235 |
| 3,008,089 | 11/1961 | Uhlir | 317—235 XR |
| 3,056,888 | 10/1962 | Atalla | 317—235 XR |
| 3,105,177 | 9/1963 | Aigrain et al. | 317—234 |
| 3,246,214 | 4/1966 | Hughe | 317—235 |

JAMES D. KALLAM, *Primary Examiner.*